(12) United States Patent
Zangi et al.

(10) Patent No.: US 9,531,385 B2
(45) Date of Patent: Dec. 27, 2016

(54) METHODS AND APPARATUSES FOR MULTIPLE CONCURRENT SUB-THRESHOLD VOLTAGE DOMAINS FOR OPTIMAL POWER PER GIVEN PERFORMANCE

(71) Applicants: Uzi Zangi, Hod-Hasharon (IL); Neil Feldman, Misgav (IL)

(72) Inventors: Uzi Zangi, Hod-Hasharon (IL); Neil Feldman, Misgav (IL)

(73) Assignee: PLSense Ltd., Yokneam (IL)

( * ) Notice: Subject to any disclaimer, the term of this patent is extended or adjusted under 35 U.S.C. 154(b) by 71 days.

(21) Appl. No.: 14/510,981

(22) Filed: Oct. 9, 2014

(65) Prior Publication Data

US 2016/0105178 A1     Apr. 14, 2016

(51) Int. Cl.
*H03K 19/173*   (2006.01)
*H03K 19/177*   (2006.01)
*H01L 25/00*    (2006.01)
*H03K 19/00*    (2006.01)

(52) U.S. Cl.
CPC ...... *H03K 19/0021* (2013.01); *H03K 19/0013* (2013.01); *H03K 19/1774* (2013.01)

(58) Field of Classification Search
CPC .................. H03K 19/17736; H03K 19/17788
USPC ......................................... 326/38, 41, 47, 80
See application file for complete search history.

(56) References Cited

U.S. PATENT DOCUMENTS

2010/0289537 A1* 11/2010 Bellur ................... H03K 17/22
                                                                    327/143
2012/0170391 A1*  7/2012 Janardan .................. G11C 7/04
                                                                    365/194

\* cited by examiner

*Primary Examiner* — Daniel D Chang

(57) ABSTRACT

A method and flow for implementing an ASIC using sub-threshold technology with optimized selection of voltage and process for a given application performance. An embodiment may also implement concurrently used multiple voltage domains inside a single place and route block. The voltage domain is dynamically changed between the cells at the placement time based on the timing path requirements.

17 Claims, 5 Drawing Sheets

P&R structure using two voltage domain implemented as a multi supply mesh in ratio of 3:1

200

Figure 1 – typical logic path using multiple voltages – 100
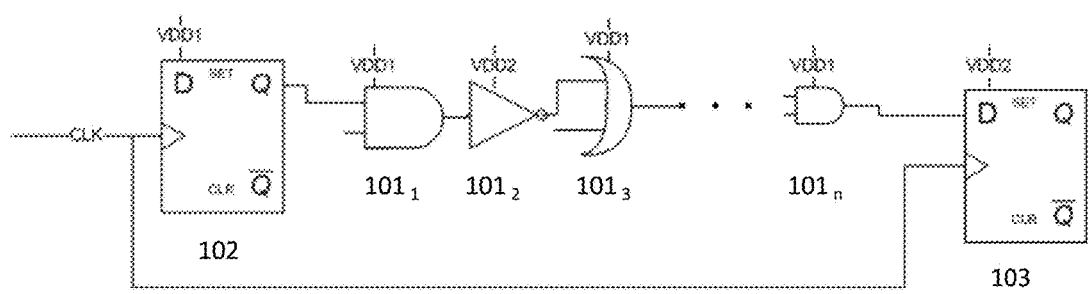

Figure 2A – Prior Art
P&R structure using single voltage domain implemented as a mesh
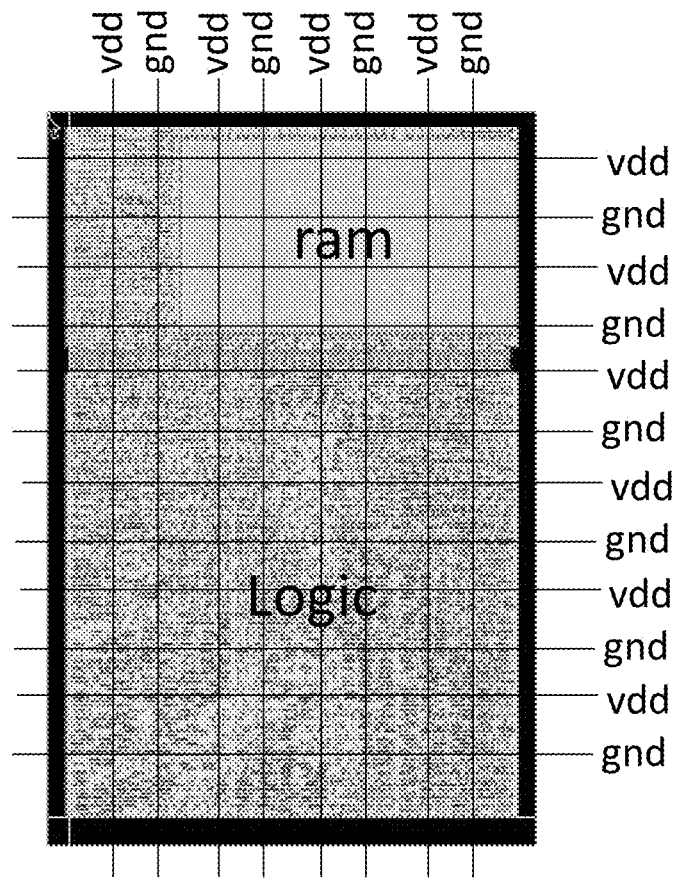
201

Figure 2B – P&R structure using two voltage domain implemented as a multi supply mesh in ratio of 3:1
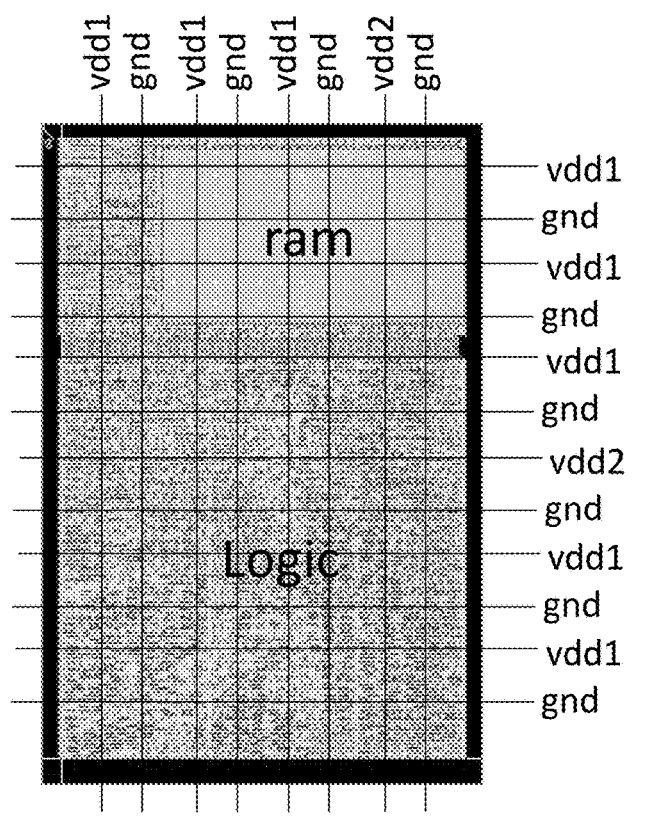
200

Figure 3 – Simulation results for 10MHz speed requirements

| 0.3V | 0.4V | 0.5V | 1.1V | Voltage |
|---|---|---|---|---|
| 7 | 44 | 145 | 1000 | # stages possible in 10Mhz path |
| 0.15 | 0.27 | 0.44 | 1.21 | Power per stage [nW] |
| 12% | 22% | 36% | 100% | Power ratio to 1.1V |

\* All results are on minimal device sizes run at nominal voltage, temperature and typical corner

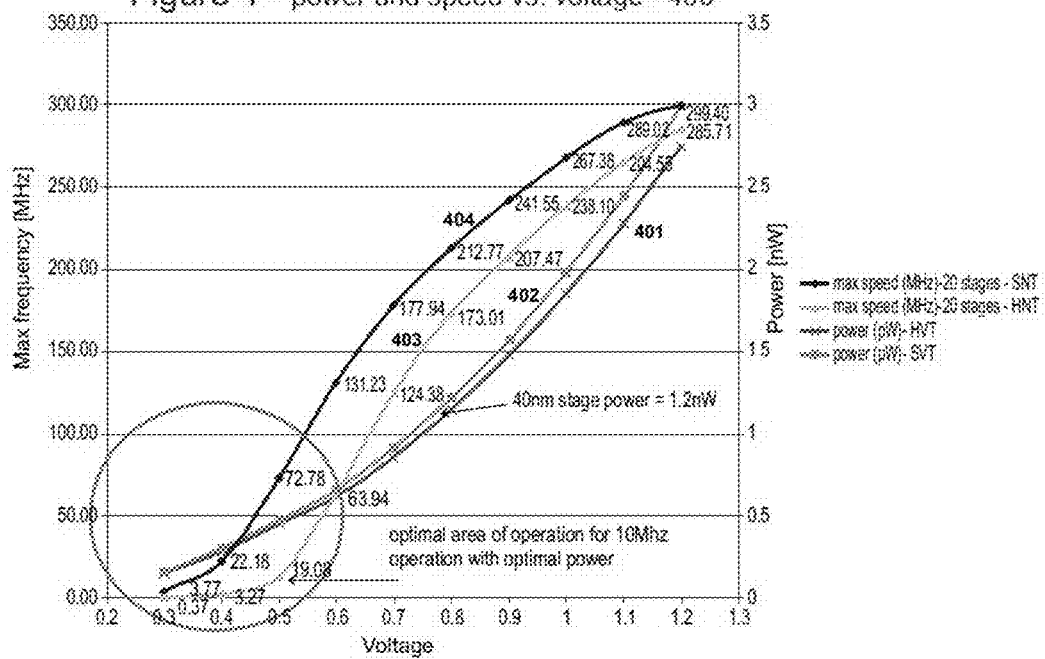

METHODS AND APPARATUSES FOR MULTIPLE CONCURRENT SUB-THRESHOLD VOLTAGE DOMAINS FOR OPTIMAL POWER PER GIVEN PERFORMANCE

CLAIM OF PRIORITY

This application claims priority from U.S. Provisional patent application No. 61/908,760, entitled "METHODS AND APPARATUSES FOR MULTIPLE CONCURRENT SUB-THRESHOLD VOLTAGE DOMAINS FOR OPTIMAL POWER PER GIVEN PERFORMANCE", filed on Nov. 26, 2013.

FIELD

Embodiments of the invention relate generally to the field of silicon design flow, and more specifically to a sub-threshold implementation of ultra-low power design flow.

BACKGROUND

Many new emerging applications require the use of ultra-low power consumption solutions inside a chip. This will allow them to be incorporated into devices that operate from a small non-chargeable battery for very long periods without the need to frequently charge the battery. For example, wearable, mobile devices and IoT (Internet of Things) devices may require an ultra-low power design flow.

Sub-threshold technology is a way of operating the CMOS transistors in their weak inversion state where the transistors are never fully turned on. When operating in the sub-threshold region, the transistor state varies between being fully turned off and partially turned on.

Sub-threshold technology is considered to be the most energy-efficient solution for low power applications where area and performance is of secondary importance.

When operating in the sub-threshold region, transistors operate at a lower voltage than their threshold voltage (known as VT) and by such operation the transistor uses less power. During sub-threshold voltage operation, the use of both dynamic power and static power is reduced. Dynamic power is a ratio of the operating voltage by a power of two and static power is a ratio of the operating voltage, therefore reducing the operating voltage of the device to a sub-threshold voltage level will reduce the consumed power dramatically.

One of the major limiting factors for using sub-threshold technology is the very low performance of the transistors at a very low voltage and due to this limitation the usage of sub-threshold technology in commercial chips is very limited.

Various methods and implementations for the sub-threshold technology exist today that focus only on power reduction and not on the optimal way to use this technology for a given power per performance required by a specific application.

In order for this technology to have practical application, a method is required that optimizes power consumption while still meeting the performance requirements for a specific product or application.

SUMMARY

For one embodiment of the invention, a sub-threshold technology flow implementation is provided that optimizes power for a given performance requirement of a known application by optimizing the voltage level used for the given timing path requirement.

Additionally, embodiments of the invention also include implementation and characterization of a standard cell and memory libraries that are optimized for use at sub-threshold voltage levels, and that can operate at multiple voltage levels.

Embodiments of the invention allow a sub-threshold implementation of ultra-low power design flow. Embodiments of the invention may be used by any system which requires low processing power with ultra-low power consumption.

Additionally, embodiments also include implementation of a place and route (P&R) flow that concurrently uses multiple voltages on the same P&R block where the usage of each voltage is optimized according to the timing requirements of that specific path.

Additionally, embodiments of the invention may also include a method for selecting optimal voltage levels for a given target frequency in order to get the lowest power consumption.

Finally, embodiments also include definition of voltage levels that can be used for a given process that may reduce the need for a level shifter between cells that operate at different voltage domains.

BRIEF DESCRIPTION OF THE DRAWINGS

The invention may be understood by referring to the following description and accompanying drawings that are used to illustrate embodiments of the invention. In the drawings:

FIG. 1 illustrates an exemplary logic path comprising logic cells between two registers and implementing multiple voltage levels in accordance with one embodiment of the invention;

FIG. 2A illustrates a place and route structure implementing single voltage domains implemented as a mesh in accordance with one embodiment of the prior art;

FIG. 2B illustrates a place and route structure implementing two voltage domains implemented as a multi supply mesh in ratio of 3:1 in accordance with one embodiment of the invention;

FIG. 3 illustrates a comparison table between varying operating voltages versus nominal operating voltage technology; and FIG. 4 illustrates a power vs. performance curve indicating determined optimal voltage points in accordance with one embodiment of the invention.

DETAILED DESCRIPTION

A flow to design a Sub-Threshold solution ASIC using optimal power per performance needs the use of multiple concurrent voltage domains inside a single P&R.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

FIG. 1 illustrates an exemplary logic path comprising logic cells between two registers and implementing multiple voltage levels in accordance with one embodiment of the invention. As shown in FIG. 1, logic path 100 comprises multiple logic cells, shown for example as logic cells $101_1$-$101n$, between register 102 and register 103. As shown, the exemplary logic path 100 has two voltage levels which may be used; VDD1 is the operating voltage of register 102 and some cells at the path VDD2 is the operating voltage of register 103 and the other cells at the path.

FIG. 2 illustrates a place and route structure 200 implementing multiple voltage domains in accordance with one embodiment of the invention. As shown in FIG. 2, a place and route structure scheme 201 of the prior art includes one supply voltage designated Vdd. In accordance with one embodiment of the invention, place and route structure 200 include two supply voltages shown as Vdd1 and Vdd2 implemented as a multi-supply mesh that provides multiple supply voltages for concurrent use. Place and route structure 200 implements as an example two supply voltages for concurrent use in a 3-to-1 ratio (i.e. three Vdd1 for every Vdd2). In accordance with various alternative embodiments of the invention, two or more supply voltages are implemented for concurrent use in various desired ratios.

FIG. 3 illustrates a comparison table between varying operating voltages versus nominal operating voltage technology. As shown in FIG. 3, three operating voltage levels (0.5 V, 0.4 V and 0.3 V) are compared to the 1.1 V operating voltage. FIG. 3 shows one example of how the operating voltage may be reduced based upon the number of stages possible for a 10 MHz path at an operating voltage of 1.1 V and a path at each of the various numbers of possible stages. FIG. 3 shows the reduced operating voltages as well as the corresponding reduction in power per stage.

The results shown in FIG. 3 are in reference to minimal device sizes that are run at nominal voltage, temperature and at typical corner.

FIG. 4 illustrates a power vs. performance curves 400 indicating determined optimal voltage points for power and max frequency in accordance with one embodiment of the invention. As shown in FIG. 4, graph 401 is the power per voltage for HVT cells, graph 402 is the power per voltage for SVT cells, graph 403 is the max frequency per voltage for HVT cells and graph 404 is the max frequency per voltage for SVT cells. It can be seen from the graphs that when the voltage changes from 0.4 v to 0.5 v (25% only) the frequency jumps from 3 MHz to 19 MHz which is more than 6×.

Embodiments of the invention have been described as including various operations. Many of the processes are described in their most basic form, but operations can be added to or deleted from any of the processes without departing from the scope of the invention.

For one embodiment of the invention, the implementation may be effected using a synthesis and P&R flow that can select an optimal choice of voltage domain per cell given the timing requirement of this cell in the specific logic path it is used in. For example, in a typical design less than 10% of the paths are critical in timing and have a maximal number of stages for a given speed, while 90% or more of the paths are more relaxed in timing and are not defined as "critical timing paths". Therefore a majority of the cells will use the typical sub-threshold voltage domain and minority of the cells (typically less than 10%) will use a slightly higher voltage to enable them to meet the timing path requirement. That is, for critical timing paths more cells will use a higher voltage domain and on non-critical timing paths all cells will use standard or low voltage domains.

For one embodiment of the invention, an optimal flow is included for arrangement of multiple voltage domain power lines inside the P&R block as described above in reference to FIG. 2. For such an embodiment, the arrangement of multiple voltage domains is used by the P&R tool to achieve optimal timing and power needs.

For one embodiment of the invention, a flow of selection for the optimal voltage and process to be used for a given frequency and performance on a given application is also included.

Electronic circuit simulations (i.e., SPICE simulations) were used to compare different processes and voltage levels to achieve the best power. The selection of the high and low voltage levels is also done by simulation in order to get the optimal difference between the voltage levels without requiring a level shifter between domains

What is claimed is:

1. A method for designing an application-specific integrated circuit (ASIC), comprising:
   placing cells in a place and route block of said ASIC;
   selecting a first plurality of said cells for operation in a sub-threshold voltage domain and a second plurality of said cells for operation in a second voltage domain;
   routing voltage connections of said first plurality of cells to sub-threshold voltage inputs configured to input a supply voltage in the sub-threshold voltage domain; and
   routing voltage connections of said second plurality of cells to second voltage domain inputs configured to input a supply voltage in the second voltage domain;
   wherein said voltage connections of said first plurality of cells and said voltage connections for said second plurality of cells are in different power rows of said place and route block.

2. The method according to claim 1, wherein said voltage connections are routed as a multi-supply mesh.

3. The method according to claim 1, wherein said voltage connections support concurrent operation of a plurality of power domains on said place and route block, said domains being connected to different power rows.

4. The method according to claim 3, further comprising selecting a ratio of said power rows for said power domains based on power and timing requirements of said place and route block.

5. The method according to claim 1, further comprising changing a cell operating voltage dynamically at placement time according to a timing requirement of a timing path.

6. The method according to claim 1, further comprising optimizing a voltage level difference between said sub-threshold-voltage domain and said second voltage domain to minimize a need for level shifting between cells.

7. The method according to claim 1, wherein said second voltage domain is a near-threshold voltage domain.

8. The method according to claim 1, further comprising routing connections amongst said first plurality of cells to provide at least one path for operation in said sub-threshold voltage domain and routing connections amongst said second plurality of cells to provide at least one path for operation in said second voltage domain.

9. The method according to claim 1, further comprising selecting said first plurality of cells and said second plurality of cells in accordance with performance requirements of said ASIC.

10. The method according to claim 9, wherein said performance requirements comprise at least one of timing path requirements and target frequency requirements.

11. An application-specific integrated circuit (ASIC), said ASIC comprising a plurality of cells, comprising:
   sub-threshold voltage inputs, configured to input a supply voltage in a sub-threshold voltage domain;
   second voltage domain inputs, configured to input a supply voltage in a second voltage domain; and
   a place and route block comprising:
      a first plurality of cells with voltage connections to said sub-threshold voltage inputs and further connected to form at least one path for operation in said sub-threshold voltage domain; and
      a second plurality of cells with voltage connections to said second voltage domain inputs and further connected to form at least one path for operation in said second voltage domain;
      wherein said voltage connections of said first plurality of cells and said voltage connections for said second plurality of cells are in different power rows of said place and route block.

12. The ASIC according to claim 11, wherein said voltage connections are routed as a multi-supply mesh.

13. The ASIC according to claim 11, wherein said voltage connections support concurrent operation of a plurality of power domains on said place and route block, said power domains being connected to different power rows.

14. The ASIC according to claim 11, further comprising a first voltage source in said sub-threshold voltage domain connected to said sub-threshold voltage inputs and a second voltage source in said second voltage domain connected to said second voltage inputs.

15. The method for sub-threshold operation of an application-specific integrated circuit (ASIC), said method comprising:
   providing an ASIC comprising:
      a place and route block comprising a first plurality of cells connected to a first supply voltage in a sub-threshold voltage domain, and further connected to form at least one path for operation in said sub-threshold voltage domain, and a second plurality of cells connected to a second supply voltage in a second voltage domain, and further connected to form at least one path for operation in said second voltage domain;
   concurrently operating said first plurality of cells in said sub-threshold voltage domain and said second plurality of cells in said second voltage domain;
   wherein voltage connections to said first plurality of cells and voltage connections to said second plurality of cells are in different power rows of said ASIC.

16. The method according to claim 15, wherein voltage connections in said place and route block are configured as a multi-supply mesh.

17. The method according to claim 15, further comprising changing said operating voltages dynamically according to a timing requirement of a timing path.

* * * * *